United States Patent
Lin et al.

(10) Patent No.: US 9,418,933 B2
(45) Date of Patent: Aug. 16, 2016

(54) THROUGH-SUBSTRATE VIA FORMATION WITH IMPROVED TOPOGRAPHY CONTROL

(71) Applicant: Taiwan Semiconductor Manufacturing Company, Ltd., Hsin-Chu (TW)

(72) Inventors: Yung-Chi Lin, Su-Lin (TW); Yi-Hsiu Chen, Hsin-Chu (TW); Ku-Feng Yang, Baoshan Township (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/709,578

(22) Filed: May 12, 2015

(65) Prior Publication Data

US 2015/0249049 A1 Sep. 3, 2015

Related U.S. Application Data

(62) Division of application No. 13/678,113, filed on Nov. 15, 2012, now Pat. No. 9,064,850.

(51) Int. Cl.

| H01L 23/48 | (2006.01) |
|---|---|
| H01L 23/528 | (2006.01) |
| H01L 21/768 | (2006.01) |
| H01L 21/02 | (2006.01) |
| H01L 23/50 | (2006.01) |
| H01L 23/522 | (2006.01) |
| H01L 23/532 | (2006.01) |

(52) U.S. Cl.
CPC ........ *H01L 23/528* (2013.01); *H01L 21/02107* (2013.01); *H01L 21/76898* (2013.01); *H01L 23/481* (2013.01); *H01L 23/50* (2013.01); *H01L 23/5226* (2013.01); *H01L 23/53238* (2013.01); *H01L 2924/0002* (2013.01)

(58) Field of Classification Search
CPC ............ H01L 2225/06541; H01L 2221/1036; H01L 23/50; H01L 23/528; H01L 23/481; H01L 23/5226; H01L 23/53238
USPC .................................. 257/758, 774, E23.142
See application file for complete search history.

(56) References Cited

U.S. PATENT DOCUMENTS

| 5,635,423 A | 6/1997 | Huang et al. |
|---|---|---|
| 5,654,589 A * | 8/1997 | Huang .............. H01L 21/28518 257/751 |
| 6,020,255 A * | 2/2000 | Tsai .................. H01L 21/76807 257/E21.579 |
| 6,204,559 B1 | 3/2001 | Lin et al. |
| 6,265,319 B1 | 7/2001 | Jang |

(Continued)

FOREIGN PATENT DOCUMENTS

CN 101556944 A 10/2009

*Primary Examiner* — Nitin Parekh
(74) *Attorney, Agent, or Firm* — Slater Matsil, LLP (57) ABSTRACT

A device include a substrate and an interconnect structure over the substrate. The interconnect structure comprising an inter-layer dielectric (ILD) and a first inter-metal dielectric (IMD) formed over the ILD. A through-substrate via (TSV) is formed at the IMD extending a first depth through the interconnect structure into the substrate. A metallic pad is formed at the IMD adjoining the TSV and extending a second depth into the interconnect structure, wherein the second depth is less than the first depth. Connections to the TSV are made through the metallic pad.

19 Claims, 6 Drawing Sheets

(56) References Cited

U.S. PATENT DOCUMENTS

| | | |
|---|---|---|
| 6,436,810 B1 | 8/2002 | Kumar et al. |
| 6,452,274 B1 * | 9/2002 | Hasegawa ......... H01L 21/02115 257/3 |
| 6,472,723 B1 * | 10/2002 | Jarstad .................. H01L 21/743 257/503 |
| 6,492,735 B1 * | 12/2002 | Matsubara ........ H01L 21/76802 257/700 |
| 7,183,195 B2 | 2/2007 | Lee et al. |
| 7,199,474 B2 | 4/2007 | Buchanan et al. |
| 8,298,931 B2 * | 10/2012 | Raghuram ........ H01L 21/31144 257/E21.614 |
| 8,519,461 B2 | 8/2013 | Boyd et al. |
| 2001/0041436 A1 | 11/2001 | Parikh |
| 2001/0054769 A1 | 12/2001 | Raaijmakers et al. |
| 2003/0203619 A1 | 10/2003 | Abe |
| 2005/0170642 A1 | 8/2005 | Hineman et al. |
| 2006/0270214 A1 | 11/2006 | Iba |
| 2007/0190692 A1 * | 8/2007 | Erturk ............... H01L 21/76898 438/118 |
| 2010/0032809 A1 * | 2/2010 | Collins ................. H01L 23/481 257/621 |
| 2011/0017827 A1 | 1/2011 | Hayashi et al. |
| 2011/0034027 A1 | 2/2011 | Kuo et al. |
| 2011/0241205 A1 | 10/2011 | Kirby et al. |
| 2011/0266691 A1 | 11/2011 | Lin et al. |
| 2012/0001334 A1 | 1/2012 | Kuo et al. |
| 2012/0015517 A1 | 1/2012 | Oshida et al. |
| 2012/0205807 A1 | 8/2012 | Boyd et al. |

\* cited by examiner

THROUGH-SUBSTRATE VIA FORMATION WITH IMPROVED TOPOGRAPHY CONTROL

This application is a divisional of U.S. patent application Ser. No. 13/678,113, filed on Nov. 15, 2012, entitled "Through-Substrate via Formation with Improved Topography Control," which application is hereby incorporated herein by reference in its entirety.

BACKGROUND

Three-dimensional integrated circuits (3DIC) and stacked dies are commonly used to decrease the overall size of integrated circuits. 3DICs and stacked dies use through-substrate vias (TSVs, also referred to sometimes as through silicon vias or through vias) to connect an individual die through its backside to another die. By using vertical space, 3DICs and stacked dies are able to reduce the overall footprint of an integrated circuit. Additionally, TSVs are used to create short grounding paths through the backside of a die, which is typically covered with grounded aluminum film. However, as improvements in technology continually decrease the size of integrated circuits and its constituent components, controlling the topography of the layers in a die becomes increasingly important.

In a typical die, a substrate comprising active devices, such as transistors, is provided, an inter-layer dielectric (ILD) is formed over the substrate, and then any number of inter-metal dielectrics (IMDs), comprising metallic trenches/vias used to execute logic functions, are formed over the ILD. In a 3DIC or stacked die, a TSV may also be formed at either the ILD or an IMD. The ILD acts as a barrier between the active devices in the substrate and the metallic trenches/vias in the IMD. The ILD prevents metallic particles in the IMD from diffusing into the substrate and is crucial to the proper functioning of the active devices in the substrate.

When formed at the ILD layer, the TSV may be covered with a liner and a metal pad in the subsequent IMD layer. The liner and pad act to create a flat top surface for stable connections to the TSV. Using this method, the ILD often suffers loss due to erosion and dishing caused by the TSV's formation process. ILD loss is especially problematic for advanced technologies where the die components are so compact and precise that tolerance for such loss is very limited. Furthermore, the use of a liner causes high contact resistance between the TSV and the overlying metal pad. On the other hand, formation of the TSV at the IMD layer suffers from issues of uneven topography due to TSV's size and grain growth. This uneven topography can lead to broken and unstable connections to the TSV.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Figure 1A:
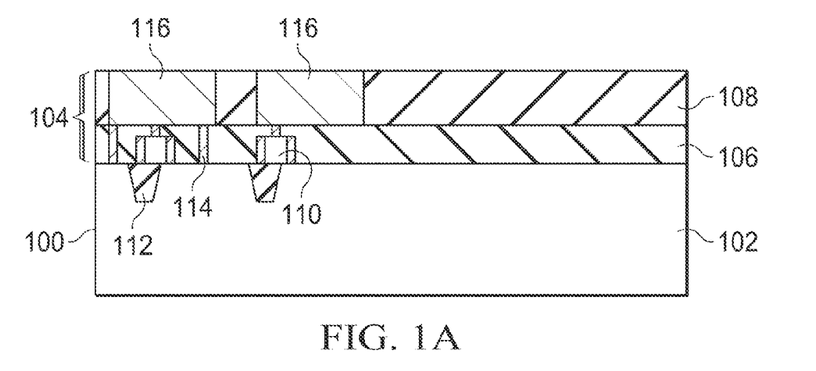
FIGS. 1A through 1G are cross-sectional views of intermediate stages of manufacture of a wafer comprising a TSV and a topographically flat portion of the TSV in accordance with various embodiments.

With reference now to FIG. 1A, wafer 100, which includes substrate 102, is provided. Substrate 102 is preferably a semiconductor substrate, suck as a bulk silicon substrate, although it may include other semiconductor materials such as group III, group IV, and/or group V elements. Integrated circuit 110, shown as transistors, and isolation fields 112 are formed on the top surface of substrate 102. Interconnect structure 104 has been formed over the top surface of substrate 102. Interconnect structure 104 includes inter-layer dielectric (ILD) 106 formed of low-k dielectric materials having k values, for example, lower than about 4.0. Contact plugs 114, made of tungsten or other similar metallic material, may be formed within ILD 106. Furthermore, interconnect structure 104 includes inter-metal dielectric (IMD) 108 containing trenches/vias 116. IMD 108 may be formed low-k dielectric materials having low k values, for example, lower than about 4.0. IMD 108 and ILD 106 could be, for example, silicon oxide, SiCOH, and the like. Trenches/vias 116 may be made of copper or copper alloy although other metals such as, aluminum, silver, gold, or combinations thereof, may also be used. The embodiment depicted in these figures show interconnect structure 104 as having only one IMD layer 108. It is contemplated in other embodiments that interconnect structure 104 will have multiple IMD layers.

Figure 1B:
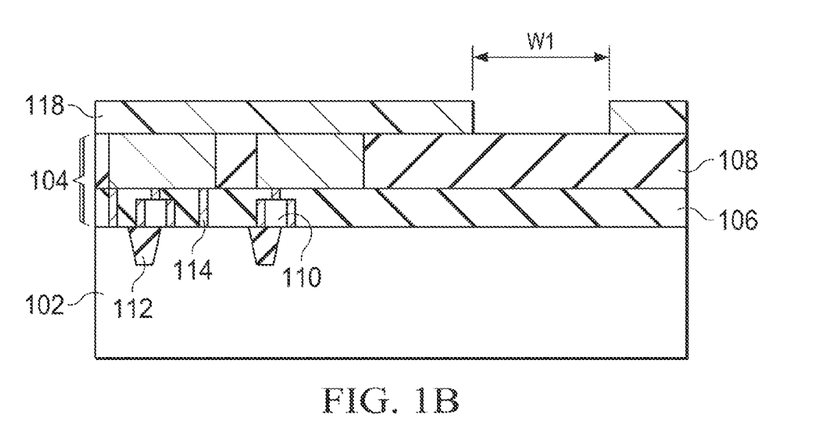

FIG. 1B shows the formation of photo resist layer 118 over the top surface of IMD 108 in wafer 100. Photo resist layer 118 is patterned to create an opening of width W1 over IMD 108, using known photolithographic techniques.

Figure 1C:
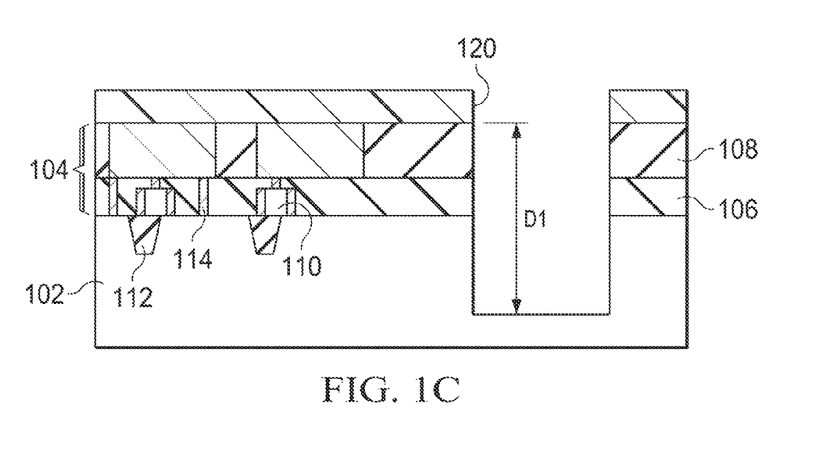

Referring to FIG. 1C, a first etch is performed to create opening 120, extending a depth of D1, through interconnect structure 104, into substrate 102, using known etching techniques. In one embodiment of this invention, photo resist layer 118 is removed after this first etch process.

Figure 1D:
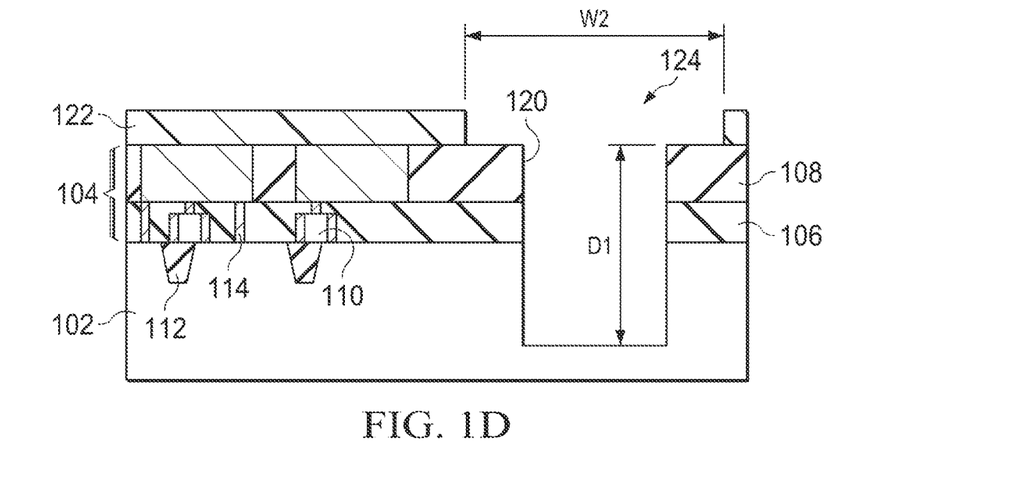

FIG. 1D shows the formation of a second photo resist layer 122 on the top surface of IMD 108 in wafer 100. Photo resist layer 122 is then patterned to have an opening 124, overlaying opening 120. Opening 124 has a width W2. Typically, width W2 will be larger than width W1. For example, in an embodiment, width W1 would be between about 5 µm and 10 µm, whereas width W2 would be between about 5.5 µm and 20 µm.

Figure 1E:
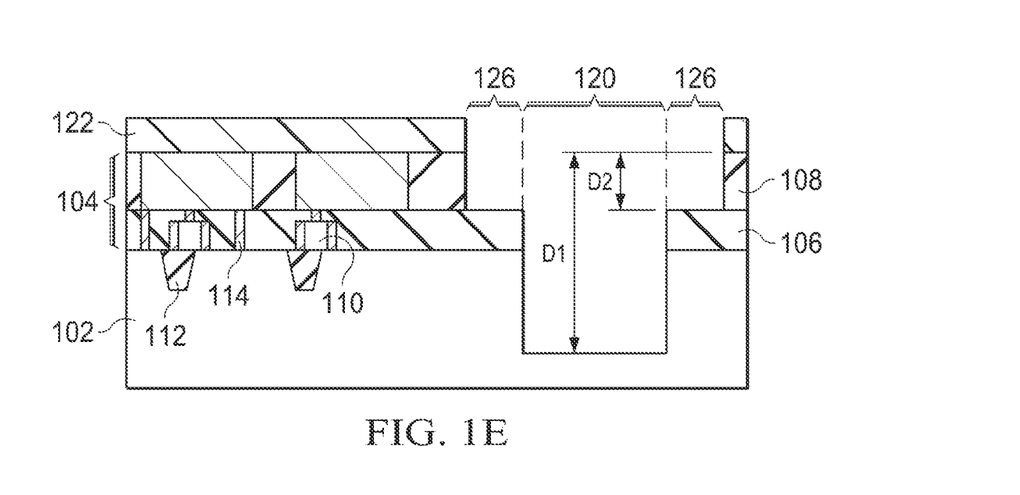

Referring to FIG. 1E, a second etch is performed, which expands opening 120 to include opening 126. This second etch extends a depth D2 into interconnect structure 104. Depth D2 is smaller than the depth D1 created during the first etch. The second etch does not extend into substrate 102. In a typical embodiment, depth D2 would be less than about 1 µm. While opening 126 is shown as extending into the top portion of ILD 106, it is contemplated that opening 126 would not reach ILD 106 in other embodiments. Following this second etch, photo resist layer 122 is removed.

In an alternative embodiment of this invention, photo resist layer 118 remains on IMD 108 after the first etch process. In this alternative embodiment, photo resist layer 118 undergoes a second patterning process after the first etch. The patterning process would remove the areas similar to those removed in photo resist layer 122 discussed above. A second etch, similar to the one discussed above, would then be performed, and photo resist layer 118 would then be removed.

Figure 1F:
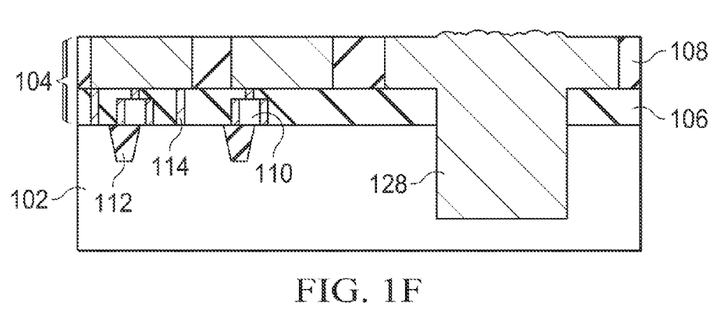

In FIG. 1F, opening 120 and opening 126, are filled with a metallic material forming through-substrate via (TSV) 128. In various embodiments, the filling material includes copper or copper alloys, although other metals such as aluminum, silver, gold, and combinations thereof, may also be used. The formation method of TSV 128 may include printing, electro plating, electroless plating, and the like. Prior to filling, a barrier layer, a liner, and/or a seed layer (not shown) may be formed within the openings 120 and 126, as known in the art. After opening 120 is filled, the metallic material is planarized using the well-known chemical mechanical polish (CMP) method to remove excess material. By forming TSV 128 at the top surface of IMD 108 instead of ILD 106, ILD loss due to erosion and dishing caused by the CMP process is avoided.

Furthermore, planarization at an IMD layer allows for the use of dummy metals during the CMP process. Dummy metals are non-functional features that do not contribute to the logic design of a wafer. These dummy metals act as a buffer during the CMP process, allowing for better erosion and dishing control during CMP. Furthermore, the metal density of a surface directly affects the rate at which the surface is planarized through CMP. Varying metal densities may lead to uneven topography after planarization. To address this problem, dummy metals are used to fill low metal density areas and create uniform metal densities across a surface. Therefore, it is known in the art to include dummy metals in IMD layers to aid the CMP process. However, dummy metals are generally unavailable at the ILD layer. By forming TSV 128 at IMD 108, dummy metals may be used during CMP. Accordingly, the resulting dishing and erosion at IMD 108 would be less than the dishing and erosion a similar CMP process would have caused at ILD 106.

Figure 1G:
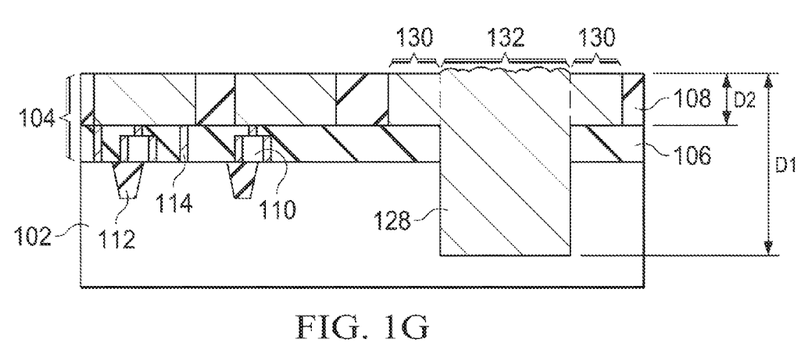

FIG. 1G shows the same wafer 100 as the wafer shown in FIG. 1F. However, for the sake of clarity, TSV 128 is shown as being divided into two regions: 130 and 132. It is noted that in TSV 128, the top surface of region 130 will be topographically flatter than the top surface of the region 132. This difference in topography is due to region 130, extending depth D2, being relatively shallow compared to region 132, extending depth D1. It has been observed that by keeping depth D2 under 1 μm, the surface topography of region 130 can be kept relatively flat. Any connections (not shown) to TSV 128 will be made to this topographically flatter region 130. By connecting to this topographically flat region 130, issues involving broken connections can be avoided allowing for more reliable connections to TSV 128. This method also eliminates high contact resistance caused by any liner, barrier, or seed layers between a TSV formed at ILD 106 and any overlaying metal features in IMD 108.

Figure 2:
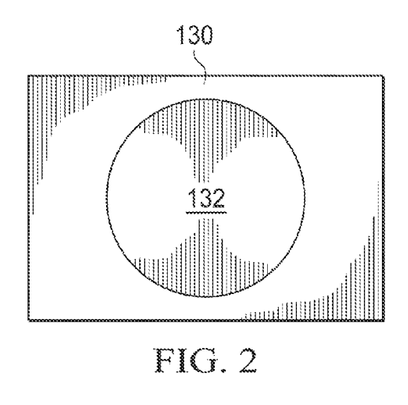
FIGS. 2 and 3 illustrate top-down views of the TSV in the wafer from FIGS. 1A-1G according to various embodiments.
Figure 3:
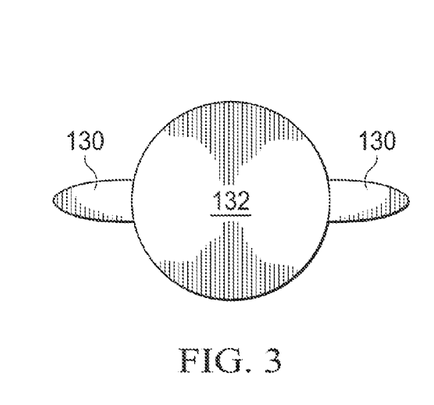

Now referring to FIG. 2, a top-down view of TSV 128 is shown. Region 130 is shown to be encompassing region 132, which corresponds to regions of TSV 128. Any connections to TSV 128 would be made to region 130. While FIG. 2 shows region 130 as rectangular, alternative shapes, such as circular or ovular, for region 130 are also contemplated in other embodiments. Furthermore, region 130 need not encompass region 132 as shown in FIG. 2. Region 130 need only adjoin region 132. For example, FIG. 3 shows an alternative embodiment where region 130 is ovular and merely adjoins region 132 instead of encompassing region 132.

In the embodiment shown in FIGS. 1A-1G, TSV 128 is shown as being formed on IMD 108. IMD 108 being the first IMD layer formed above ILD 106 in interconnect structure 104. It is contemplated, in other embodiments of this invention, to form TSV 128 on other IMD layers (not shown) in interconnect structure 104.

Figure 4A:
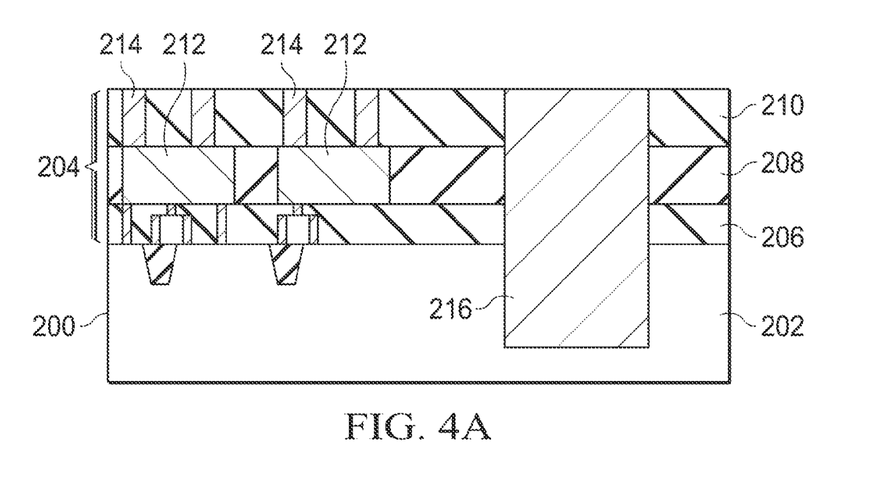
FIGS. 4A through 4D are cross-sectional views of intermediate stages of manufacture of a wafer comprising a TSV and a metal pad overlaying the TSV in accordance with various embodiments.

Now referring to FIG. 4A, an alternative embodiment of the invention is shown. FIG. 4A shows wafer 200. Wafer 200 contains substrate 202 and interconnect structure 204. Interconnect structure 204 contains ILD 206. Substrate 202 and ILD layer 206 is substantially similar to substrate 102 and ILD layer 106 in wafer 100 described above. Thus detailed descriptions of these features are omitted.

Wafer 200 was formed using a single-damascene process as opposed to a dual-damascene process. In a typical dual-damascene process, vias and trenches in a layer are formed simultaneously; therefore, a typical IMD layer may contain both trenches and vias. In a single-damascene process, trenches and vias are formed separately. Therefore interconnect structure 204 contains IMD layers formed separately as: trench layer 208, containing trenches 212, and via layer 210, containing vias 214. IMD layers 208 and 210 may all be made of low-k dielectric materials, for example, doped silicon glass, SiCOH, SiON, and the like. Trenches 212 and vias 214 may be made of copper, copper alloys, or any combination thereof. The embodiment of invention illustrated in FIG. 4A only contains one IMD trench and one IMD via layer. However, in other embodiments, interconnect structure 204 could contain any number of IMD trench layers and alternating IMD via layers.

Wafer 200 also contains TSV 216. TSV 216 is analogous to region 132 of TSV 128 in wafer 100. TSV 216 does not contain the portion of TSV 128 referred to as region 130. TSV 216 was formed using a substantially similar process as that used form TSV 128. Therefore, in-depth discussion on the formation of TSV 216 is omitted. Because TSV 216 is formed in IMD via layer 210, ILD loss due to dishing and erosion caused by the CMP process is avoided. Furthermore, dummy metals may be used to aid the CMP process because TSV 216 is formed at IMD 210. While TSV 216 is shown to be formed on the first via layer above substrate 202, TSV 216 may be formed on any other IMD via layer (not shown) in interconnect structure 204.

Figure 4B:
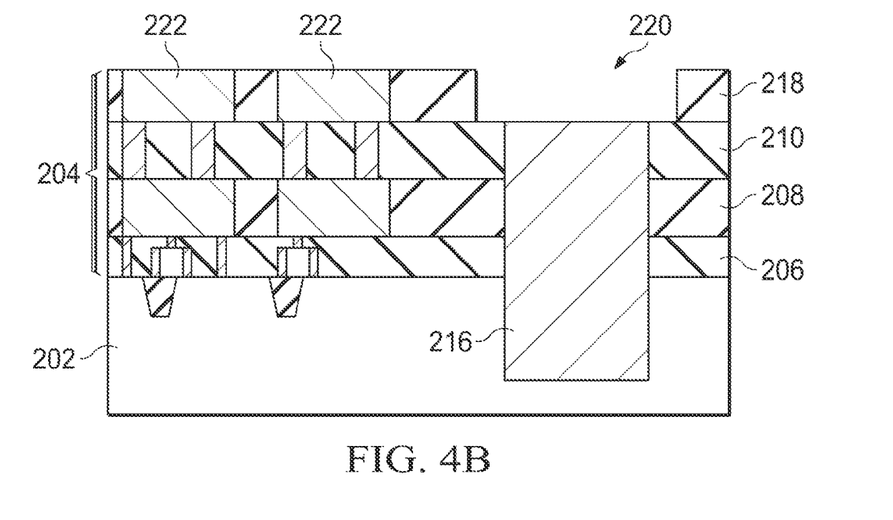

Now referring to FIG. 4B, another IMD trench layer 218 has been formed on the top surface of IMD via layer 210. IMD trench layer 218 may be made of low-k dielectric materials similar to those used to make IMDs 208 and 210. IMD 218 contains trenches 222 which are similar to trenches 212 in IMD 208. Opening 220 has been formed in IMD trench layer 218 to overlay TSV 216. Opening 220 may be formed using, for example, a combination of photolithography and etching similar to what has been previously described.

Figure 4C:
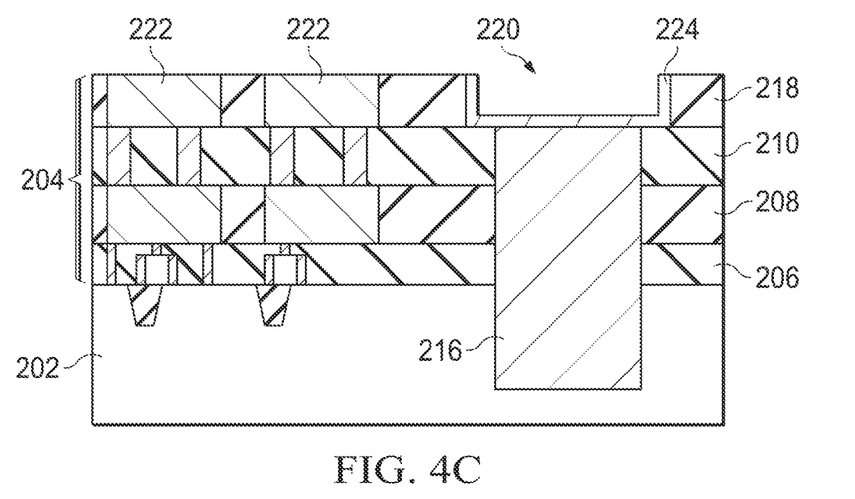

FIG. 4C shows the formation of liner 224 in opening 220. Liner 224 covers the both the lateral and vertical surfaces of opening 220. Liner 224 may be made of titanium, titanium nitrate, tantalum, tantalum nitrate, or other like material.

Figure 4D:
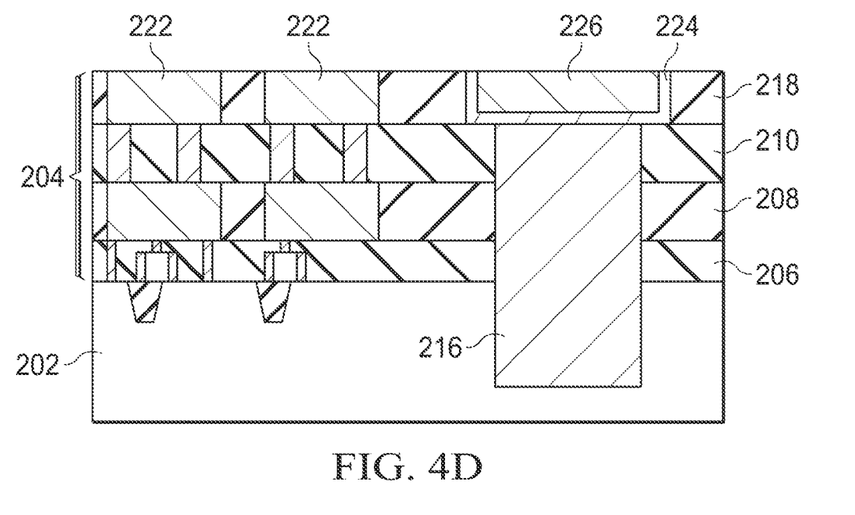

Now referring to FIG. 4D, opening 220 is then filled to form metal pad 226. Pad 226 may be formed using the same metallic materials used to form trenches 212 and 222. Pad 226's top surface is topographically flat due to liner 224 overlying TSV 216. Liner 224 also serves to prevent migration of metallic particles from pad 226 into the neighboring dielectric material in IMD 218. Reliable connections to TSV 216 may be made through the topographically flat pad 226.

While the current embodiment describes the separate formation of trenches 222 and pad 226, these features may also be formed simultaneously.

Figure 5:
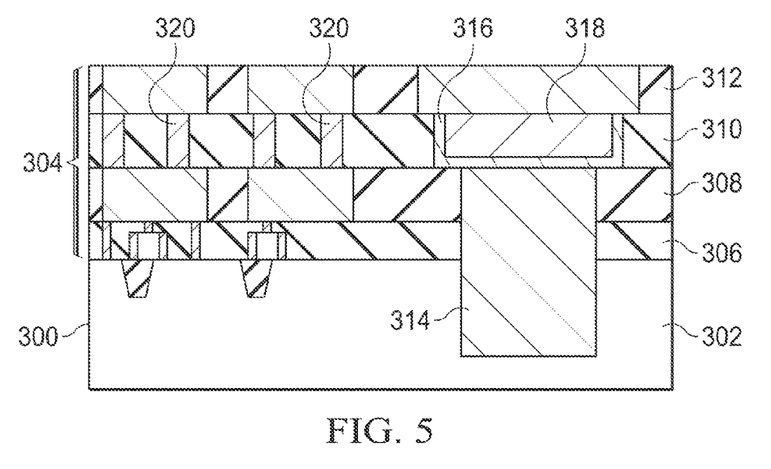
FIG. 5 shows a cross-sectional view of another wafer comprising a TSV and a metal pad overlaying the TSV according to various embodiments.

FIG. 5 shows another alternative embodiment of the invention. FIG. 5 shows wafer 300, which has been formed using a single-damascene process similar to the one used to form wafer 200. Wafer 300 contains substrate 302 and interconnect structure 304. Interconnect structure 304 contains ILD 306; IMD trench layers 308 and 312; and IMD via layer 310. Wafer 300 is analogous to wafer 200 in its formation process; therefore, detailed description of the process is omitted. However, several key differences between wafer 300 and wafer 200 and their corresponding features should be noted.

TSV 314 is formed at IMD trench layer 308. TSV 314 is not formed at an IMD via layer. Following the formation of TSV 314, IMD via layer 310 is formed containing pad 318 and vias 320. Also, liner 316 has formed to surround pad 318. Pad 318 and vias 320 may be formed simultaneously using a single-damascene process. The top surface of pad 318 is topographically flat due to liner 316 overlaying TSV 314. Liner 316 is analogous to liner 224 in wafer 200. Further IMD layers may be built on IMD via layer 310, such as IMD trench layer 312, as shown in FIG. 5.

Figure 5A:
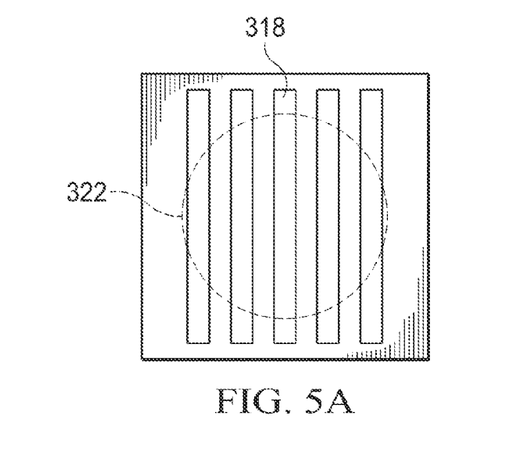
FIGS. 5A and 5B illustrate top-down views of the metal pad in the wafer from FIG. 5 in accordance with various embodiments.
Figure 5B:
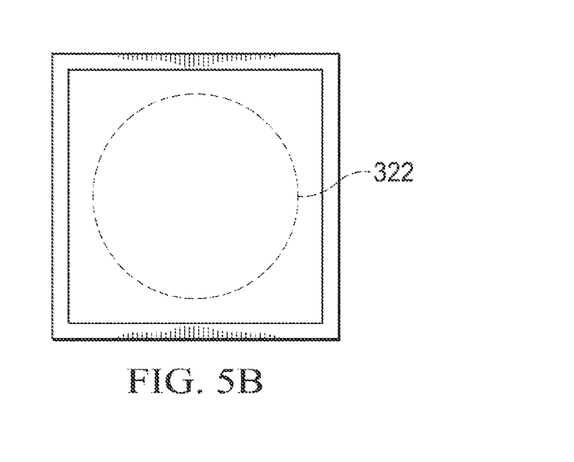

Because pad 318 and vias 320 may be formed simultaneously, pad 318 must be configured to adhere to any design rule limitations related to via formation. Referring now to FIG. 5A, a top-down view of pad 318 in IMD via layer 310 is shown. A circular region 322 corresponds to the location of TSV 314. Pad 318 is shown as overlaying region 322. In the embodiment illustrated in FIG. 5A, pad 318 is shown in a slot configuration. Alternatively, pad 318 may be a configured as a solid square, as shown in FIG. 5B; in a grid pattern, not shown; or any other suitable configuration. The configuration of pad 318 may be altered to adhere to any design rule limitations on IMD via layer 310.

In other embodiments, TSV 314 may be formed at any other IMD trench layer in interconnect structure 304. In these alternative embodiments, cap 318 would be formed on the IMD via layer directly above the IMD trench layer in which TSV 314 was formed. Furthermore, in other embodiments, IMD via layer 310 and IMD trench layer 312 may be formed simultaneously using a dual damascene process. In such cases, liner 316 may extend into IMD trench layer 312 and up the sidewalls of any trench overlaying pad 318.

In some embodiments, a device is provided. The device includes an interconnect structure over a semiconductor substrate, wherein the interconnect structure comprises an inter-layer dielectric (ILD) and an inter-metal dielectric (IMD) over the ILD. A first opening extends a first depth through the interconnect structure and into the semiconductor substrate, and a second opening contiguous with and wider than the first opening extends a second depth into the interconnect structure, wherein the second depth is smaller than the first depth. A conductive plug fills the first opening and the second opening, the conductive plug being a metallic material and having a substantially planar surface at a top of the second opening.

In yet other embodiments, a device is provided. The device includes an interconnect structure over a semiconductor substrate, wherein the interconnect structure includes an inter-layer dielectric (ILD) and a first inter-metal dielectric (IMD) formed over the ILD, the first IMD having a first metallic component therein. A conductive plug extends through the first IMD and into the semiconductor substrate, and a second IMD over the first IMD, the second IMD having a second metallic component therein. An opening in the second IMD extends to the first IMD and overlies the conductive plug and the first IMD. A liner is formed in the opening, wherein the liner covers both the bottom surface and the sidewalls of the opening, and a pad having a metallic material is in the opening.

In yet other embodiments, a device is provided. The device includes an inter-layer dielectric (ILD) over a substrate, an inter-metal dielectric (IMD) over the ILD, and interconnects in the ILD and the IMD. A first opening extends in at least the IMD a first depth from a top surface of the IMD, and a second opening is contiguous with and extends from a bottom of the first opening into the ILD and the substrate, the second opening extending a second depth from the top surface of the IMD, the first depth being less than the second depth. A conductor fills the first opening and the second opening, the conductor having a planar a top surface.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   an interconnect structure over a first side of a semiconductor substrate, wherein the interconnect structure comprises an inter-layer dielectric (ILD) and an inter-metal dielectric (IMD) over the ILD;
   a first filled opening extending a first depth through the interconnect structure and through the semiconductor substrate;
   a second filled opening contiguous with and wider than the first filled opening and extending a second depth into the interconnect structure, wherein the second depth is smaller than the first depth; and
   a conductive plug filling the first filled opening and the second filled opening, the conductive plug having a first portion in the first filled opening, a second portion in the second filled opening, and a liner completely separating the first portion and the second portion, the conductive plug being a metallic material, the conductive plug having a substantially planar surface at a top of the second filled opening, the conductive plug providing an electrical connection between the first side of the semiconductor substrate and a second side of the semiconductor substrate, the second side of the semiconductor substrate being opposite the first side of the semiconductor substrate.

2. The device according to claim 1, further comprising a connection to the conductive plug at the substantially planar surface.

3. The device according to claim 1, wherein the second depth is less than about 1μm.

4. The device according to claim 1, wherein the ILD comprises a low k dielectric.

5. The device according to claim 1, wherein the IMD comprises a low k dielectric.

6. The device according to claim 5, wherein the conductive plug comprises a metal selected from the group of copper, copper alloys, aluminum, silver gold and combinations thereof.

7. The device according to claim 1, further comprising a dummy metal in the IMD layer.

8. The device according to claim 1, wherein the second filled opening is configured in a pattern consisting essentially of a rectangle, a circle, an oval, and combinations thereof.

9. A device comprising:
- an interconnect structure over a semiconductor substrate, wherein the interconnect structure comprises an inter-layer dielectric (ILD) and a first inter-metal dielectric (IMD) formed over the ILD, the first IMD having a first metallic component therein;
- a conductive plug extending through the first IMD and through the semiconductor substrate;
- a second IMD over the first IMD, the second IMD having a second metallic component therein;
- a filled opening in the second IMD extending to the first IMD and overlying the conductive plug and the first IMD;
- a liner in the filled opening, wherein the liner covers a bottom surface and sidewalls of the filled opening; and
- a pad having a metallic material in the filled opening.

10. The device according to claim 9, wherein the first metallic component comprises copper.

11. The device according to claim 9, wherein:
- the first IMD is an IMD trench layer and the first metallic component is a trench; and
- the second IMD is an IMD via layer and the second metallic component is a via.

12. The device according to claim 9, wherein conductive plug comprises a metal selected from the group of copper, copper alloys, aluminum, silver gold and combinations thereof.

13. The device according to claim 9, wherein the filled opening is configured in a pattern consisting essentially of a rectangle, a circle, an oval, and combinations thereof.

14. The device according to claim 9, wherein the filled opening is configured in a slot pattern.

15. The device according to claim 9, further comprising a dummy metal in the first IMD.

16. The device according to claim 9, wherein the liner is a material selected from the group consisting essentially of titanium, titanium nitrate, tantalum, tantalum nitrate, and combinations thereof.

17. The device according to claim 9, wherein the pad comprises a metal selected from the group of copper and copper alloys.

18. A device comprising:
- an inter-layer dielectric (ILD) over a semiconductor substrate;
- an inter-metal dielectric (IMD) over the ILD;
- interconnects in the ILD and the IMD;
- a first filled opening in at least the IMD extending a first depth from a top surface of the IMD;
- a second filled opening contiguous with and extending from a bottom of the first filled opening through the ILD and completely through the semiconductor substrate, the second opening extending a second depth from the top surface of the IMD, the first depth being less than the second depth, wherein the first filled opening has a first lateral dimension parallel to a major surface of the substrate, the second opening has a second lateral dimension parallel to the major surface of the substrate, and the second lateral dimension is less than the first lateral dimension; and
- a conductor filling the first filled opening and the second filled opening, the conductor having a planar top surface in regions not over the second filled opening in a plan view, the conductor comprising a single material layer having no interface between the conductor filling the first opening and the conductor filling the second opening.

19. The device of claim 18, wherein the second filled opening is a circular shape when viewed from a top down and the first filled opening has a non-circular shape when viewed from a top down.

* * * * *